United States Patent
Park et al.

(10) Patent No.: US 10,861,906 B2
(45) Date of Patent: Dec. 8, 2020

(54) DISPLAY DEVICE USING SEMICONDUCTOR LIGHT-EMITTING DIODE

(71) Applicant: LG ELECTRONICS INC., Seoul (KR)

(72) Inventors: Sangdae Park, Seoul (KR); Sungjin Park, Seoul (KR); Hwankuk Yuh, Seoul (KR); Sunju Lee, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 16/465,011

(22) PCT Filed: Jan. 31, 2017

(86) PCT No.: PCT/KR2017/001026
§ 371 (c)(1),
(2) Date: May 29, 2019

(87) PCT Pub. No.: WO2018/101539
PCT Pub. Date: Jun. 7, 2018

(65) Prior Publication Data
US 2019/0295996 A1    Sep. 26, 2019

(30) Foreign Application Priority Data

Dec. 2, 2016  (KR) .................. 10-2016-0163750

(51) Int. Cl.
*H01L 27/32* (2006.01)
*H01L 33/50* (2010.01)
(Continued)

(52) U.S. Cl.
CPC ............ *H01L 27/322* (2013.01); *H01L 27/15* (2013.01); *H01L 27/3206* (2013.01);
(Continued)

(58) Field of Classification Search
None
See application file for complete search history.

(56) References Cited

U.S. PATENT DOCUMENTS

2016/0087165 A1  3/2016  Lee et al.
2016/0190515 A1  6/2016  Huang et al.
(Continued)

FOREIGN PATENT DOCUMENTS

CN       105911709 A     8/2016
KR   10-2007-0017396 A   2/2007
(Continued)

*Primary Examiner* — Cheung Lee
(74) *Attorney, Agent, or Firm* — Birch, Stewart, Kolasch & Birch, LLP

(57) ABSTRACT

The present invention relates to a display device, and more particularly, to a display device using a semiconductor light-emitting diode. The display device according to the present invention comprises: a substrate having a wiring electrode formed thereon; a plurality of semiconductor light-emitting diodes electrically connected to the wiring electrode; an insulating layer provided to fill space between the semiconductor light-emitting diodes; a polarizing filter layer which is overlapped on the insulating layer and filters light incident into a specific direction; and a wavelength conversion layer which is overlapped on the polarizing filter layer and provided to convert the wavelength of light.

14 Claims, 15 Drawing Sheets

(51) Int. Cl.
  *H01L 33/58* (2010.01)
  *H01L 33/60* (2010.01)
  *H01L 27/15* (2006.01)

(52) U.S. Cl.
  CPC ............ *H01L 33/50* (2013.01); *H01L 33/502* (2013.01); *H01L 33/58* (2013.01); *H01L 33/60* (2013.01)

(56) References Cited

U.S. PATENT DOCUMENTS

| | | | |
|---|---|---|---|
| 2016/0218142 A1 | 7/2016 | Bang | |
| 2017/0017123 A1* | 1/2017 | Lee | .................. G02F 1/133605 |
| 2018/0188610 A1* | 7/2018 | Shimizu | .................. G09G 3/36 |
| 2018/0203245 A1 | 7/2018 | Chen | |

FOREIGN PATENT DOCUMENTS

| | | |
|---|---|---|
| KR | 10-2013-0137985 A | 12/2013 |
| KR | 10-2015-0050655 A | 5/2015 |
| KR | 10-2015-0104462 A | 9/2015 |
| KR | 10-2016-0125198 A | 10/2016 |
| WO | WO 2014/030830 A1 | 2/2014 |

* cited by examiner

DISPLAY DEVICE USING SEMICONDUCTOR LIGHT-EMITTING DIODE

CROSS REFERENCE TO RELATED APPLICATIONS

This application is the National Phase of PCT International Application No. PCT/KR2017/001026, filed on Jan. 31, 2017, which claims priority under 35 U.S.C. 119(a) to Patent Application No. 10-2016-0163750, filed in the Republic of Korea on Dec. 2, 2016, all of which are hereby expressly incorporated by reference into the present application.

BACKGROUND OF THE INVENTION

1. Field of the Invention

The present disclosure relates to a display device and a fabrication method thereof, and more particularly, to a display device using a semiconductor light-emitting diode.

2. Description of the Conventional Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs). However, there exist problems such as not-so-fast response time, difficult implementation of flexibility in case of LCDs, and there exist drawbacks such as short life span, not-so-good yield as well as low flexibility in case of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light-emitting diodes may be used to implement a flexible display, thereby presenting a scheme for solving the problems.

A structure of exciting light emitted from the semiconductor light-emitting diode using a wavelength conversion layer and filtering the light with a wavelength of red or green using a color filter may be applicable to the flexible display using the semiconductor light-emitting diode. In such a structure, there is a problem that the wavelength conversion layer is deteriorated, and luminance and uniformity are lowered due to the characteristics of a micro light emitting device that is a point light source. In particular, because of such disadvantages, it is difficult to apply to a digital signage display, a flexible display, and the like. Accordingly, in the present disclosure, a new mechanism capable of solving such a problem is presented.

SUMMARY OF THE INVENTION

An object of the present disclosure is to provide a display device capable of outputting light in the form of a surface light source even though a micro light emitting device that is a point light source is used.

Another object of the present disclosure is to provide a display device capable of increasing durability while improving image quality.

A display device according to the present disclosure increases the brightness and durability of a display device using a fluorescent filter and a polarizing filter.

For a specific example, the display device may include a substrate formed with wiring electrodes, a plurality of semiconductor light-emitting diodes electrically connected to the wiring electrodes, an insulating layer configured to fill between the semiconductor light-emitting diodes, a polarizing filter layer configured to overlap with the insulating layer to filter light incident in a specific direction, and a wavelength conversion layer configured to overlap with the polarizing filter layer to convert the wavelength of light.

According to an embodiment, the polarizing filter layer may include a plurality of polarizers sequentially disposed along one direction so as to overlap with the plurality of semiconductor light-emitting diodes, respectively. Black matrices may be disposed between the plurality of polarizers along the one direction. The wavelength conversion layer may overlap with the plurality of semiconductor light-emitting diodes, respectively, and may include a plurality of phosphor portions formed between the black matrices.

According to an embodiment, at least part of the polarizing filter layer may be formed to be concave toward the wavelength conversion layer. The polarizing filter layer may include a plurality of polarizers, and an incident surface on which light emitted from the semiconductor light-emitting diodes is incident may be formed to be concave, in each of the plurality of polarizers. Fine grooves due to texturing may be formed on the incident surface.

According to an embodiment, the polarizing filter layer may be disposed between the insulating layer and the wavelength conversion layer along a thickness direction of the wavelength conversion layer. An adhesive layer may be formed between the polarizing filter layer and the insulating layer, and at least part of the adhesive layer may be formed to be convex toward the polarizing filter layer.

According to an embodiment, the insulating layer may be partitioned by a partition wall disposed between the semiconductor light-emitting diodes. The partition wall may be formed at a position corresponding to a black matrix for partitioning the wavelength conversion layer into a plurality of phosphor portions. The black matrix may have a cross-sectional area larger than that of the partition wall. At least part of the black matrix may be protruded from the polarizing filter layer toward the semiconductor light-emitting diode.

In a display device according to the present disclosure, a black matrix, a wavelength conversion layer, and a polarizing filter layer may be combined to provide a micro semiconductor light-emitting diode that is a point light source, but light may be output in a form similar to a surface light source. Through this, the brightness and uniformity of a display are increased to improve image quality and efficiency.

Furthermore, in the present disclosure, as the polarizing filter layer has a structure of a concave lens, light may be uniformly dispersed over the entire surface.

In addition, in the present disclosure, the wavelength conversion layer may be implemented in the form of a fluorescent filter to which a black matrix is applied, thereby mitigating and preventing the deterioration of a yellow phosphor. Through this, the durability of the display may be increased.

Moreover, in the present disclosure, light may be blocked in a pixel direction through the black matrix and the polarizing filter layer, thereby providing a color mixture prevention function.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENT

Figure 1:
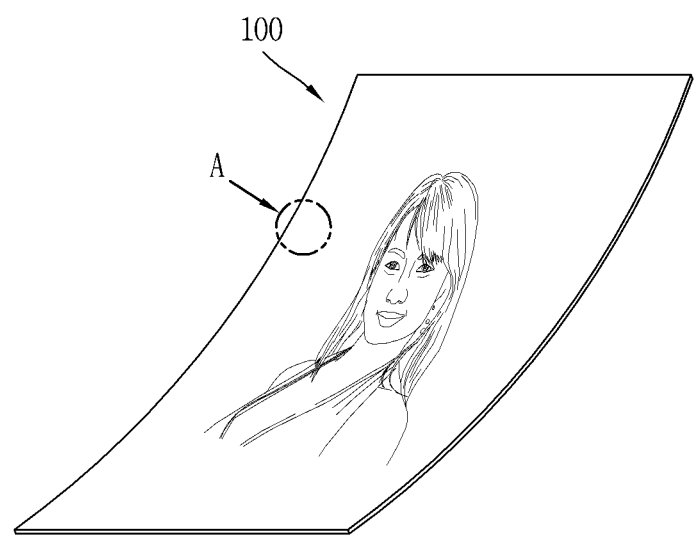
FIG. 1 is a conceptual view illustrating a display device using a semiconductor light-emitting diode according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light-emitting diode according to an embodiment of the present disclosure.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be realized in such a manner that a light emission of each unit pixel (sub-pixel) arranged in a matrix configuration is controlled independently. The unit pixel denotes an elementary unit for representing one color.

The sub-pixel of the flexible display may be implemented by a semiconductor light-emitting diode. According to the present disclosure, a light emitting diode (LED) is illustrated as a type of semiconductor light-emitting diode. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
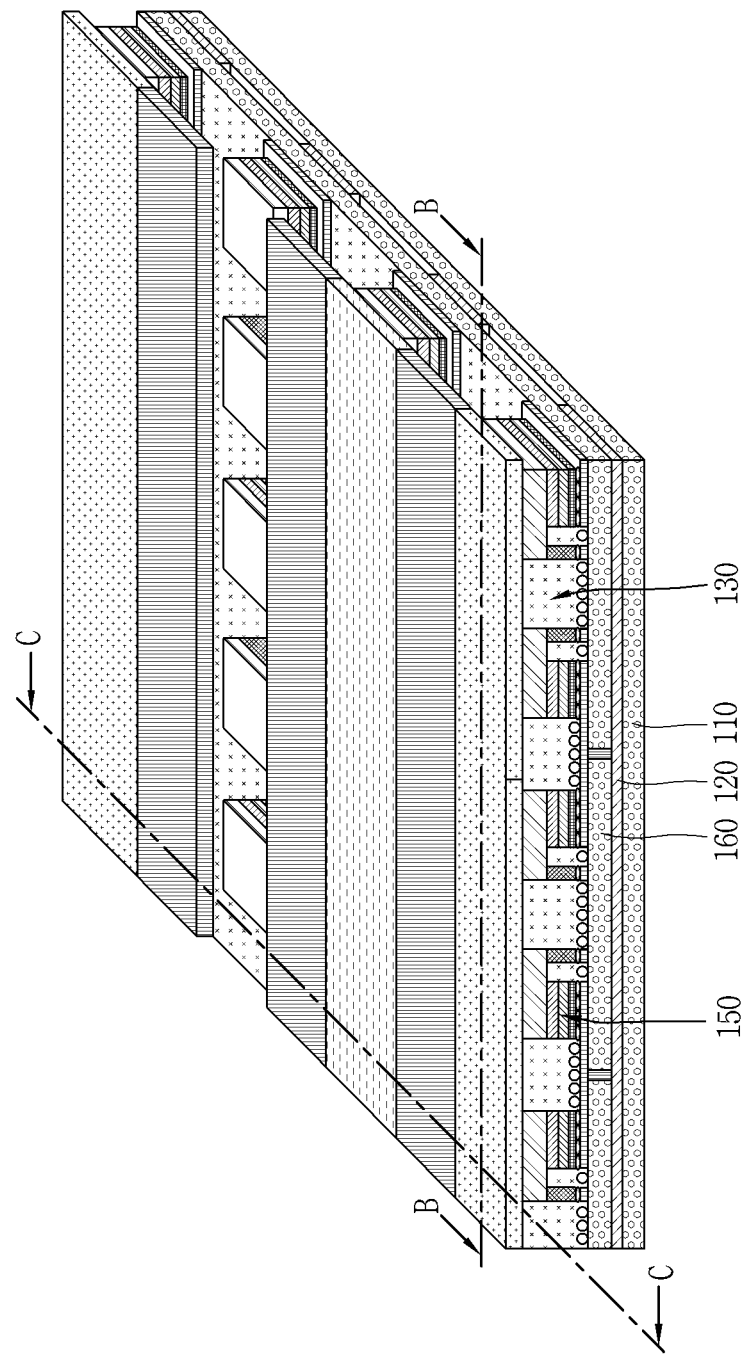
FIG. 2 is a partial enlarged view of portion "A" in FIG. 1, and FIGS. 3A and 3B are cross-sectional views taken along lines B-B and C-C in FIG. 2.
Figure 3A:
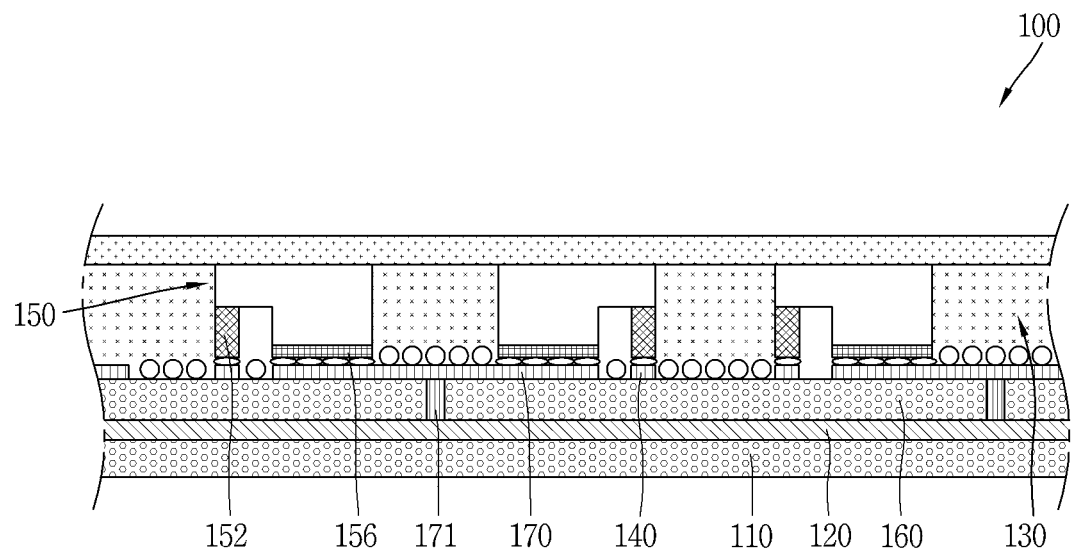
Figure 3B:
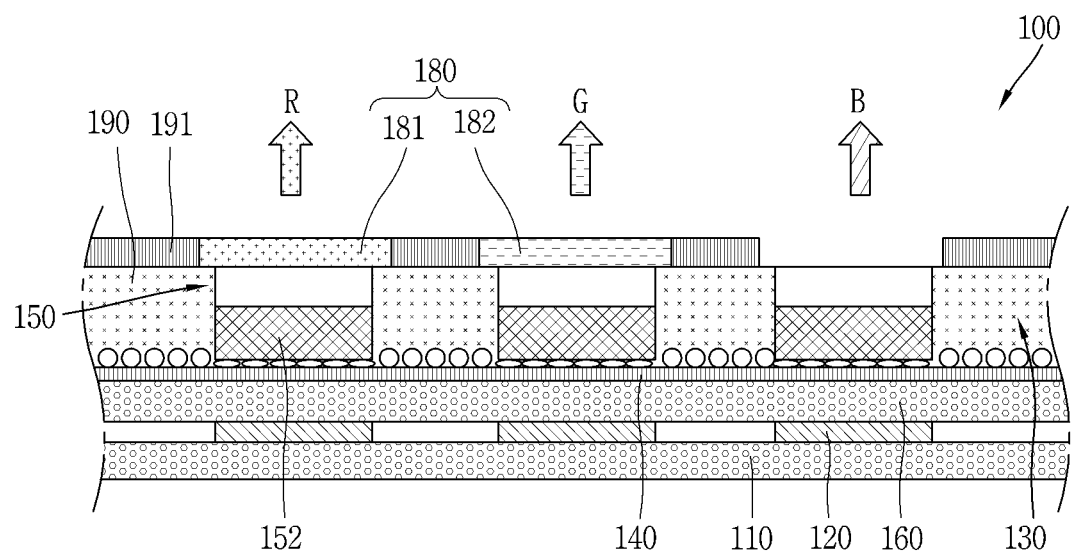
Figure 4:
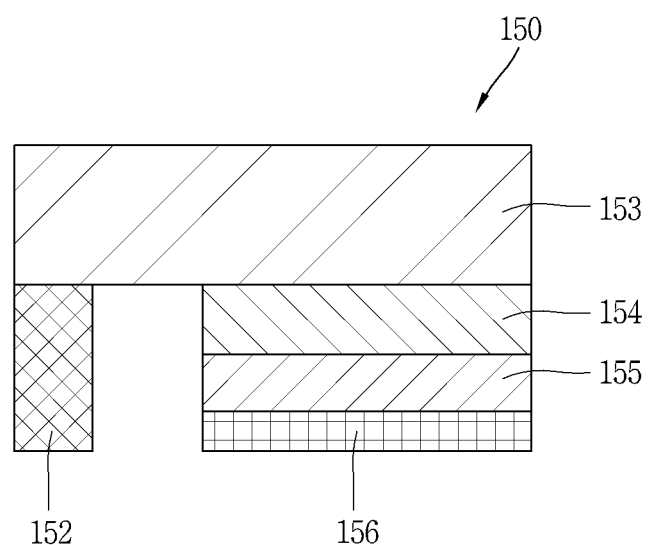
FIG. 4 is a conceptual view showing a flip chip type semiconductor light-emitting diode in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light-emitting diode in FIG. 3A, and FIGS. 5A through 5C are conceptual views illustrating various forms for implementing colors in connection with a flip-chip type semiconductor light-emitting diode.

According to the drawings in FIGS. 2, 3A and 3B, there is illustrated a display device 100 using a passive matrix (PM) type semiconductor light-emitting diode as a display device 100 using a semiconductor light-emitting diode. However, an example described below may also be applicable to an active matrix (AM) type semiconductor light-emitting diode.

The display device 100 may include a substrate 110, a first electrode 120, a conductive adhesive layer 130, a second electrode 140, and a plurality of semiconductor light-emitting diodes 150.

The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light-emitting diode 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in this example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light-emitting diode 150 is connect thereto in a flip chip form with the application of heat and pressure, the semiconductor light-emitting diode 150 is electrically connected to the first electrode 120 and second electrode 140.

Referring to FIG. 4, the semiconductor light-emitting diode may be a flip chip type semiconductor light-emitting diode.

For example, the semiconductor light-emitting diode may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light-emitting diodes 150. For example, the left and right p-type electrodes of the semiconductor light-emitting diodes around the auxiliary electrode may be electrically connected to one auxiliary electrode.

More specifically, the semiconductor light-emitting diode 150 is pressed into the conductive adhesive layer 130, and through this, only a portion between the p-type electrode 156 and auxiliary electrode 170 of the semiconductor light-emitting diode 150 and a portion between the n-type electrode 152 and second electrode 140 of the semiconductor light-emitting diode 150 have conductivity, and the remaining portion does not have conductivity since there is no push-down of the semiconductor light-emitting diode. As described above, the conductive adhesive layer 130 may form an electrical connection as well as allow a mutual coupling between the semiconductor light-emitting diode 150 and the auxiliary electrode 170 and between the semiconductor light-emitting diode 150 and the second electrode 140.

Furthermore, a plurality of semiconductor light-emitting diodes 150 constitute a light-emitting array, and a phosphor layer 180 is formed on the light-emitting array.

The light emitting device array may include a plurality of semiconductor light-emitting diodes with different self-luminance values. Each of the semiconductor light-emitting diodes 150 constitutes a sub-pixel, and is electrically connected to the first electrode 120. For example, there may exist a plurality of first electrodes 120, and the semiconductor light-emitting diodes are arranged in several rows, for instance, and each row of the semiconductor light-emitting diodes may be electrically connected to any one of the plurality of first electrodes.

Furthermore, the semiconductor light-emitting diodes may be connected in a flip chip form, and thus semiconductor light-emitting diodes grown on a transparent dielectric substrate. Furthermore, the semiconductor light-emitting diodes may be nitride semiconductor light-emitting diodes, for instance. The semiconductor light-emitting diode 150 has an excellent luminance characteristic, and thus it may be possible to configure individual sub-pixels even with a small size thereof.

According to the drawing, a partition wall 190 may be formed between the semiconductor light-emitting diodes 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light-emitting diode 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light-emitting diode 150. For example, the semiconductor light-emitting diode 150 is a blue semiconductor light-emitting diode that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light-emitting diode 151 at a location implementing a red sub-pixel, and a green phosphor 182 capable of converting blue light into green (G) light may be deposited on the blue semiconductor light-emitting diode 151 at a location implementing a green sub-pixel. Furthermore, only the blue semiconductor light-emitting diode 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light-emitting diode 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
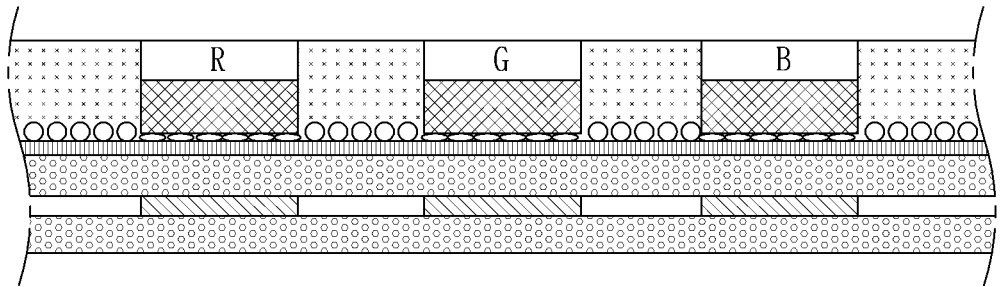
FIGS. 5A through 5C are conceptual views illustrating various forms for implementing colors in connection with a flip-chip type semiconductor light-emitting diode.

Referring to FIG. 5A, each of the semiconductor light-emitting diodes 150 may be implemented with a high-power light emitting device that emits various lights including blue in which gallium nitride (GaN) is mostly used, and indium (In) and or aluminum (Al) are added thereto.

In this case, the semiconductor light-emitting diode 150 may be red, green and blue semiconductor light-emitting diodes, respectively, to implement each sub-pixel. For instance, red, green and blue semiconductor light-emitting diodes (R, G, B) are alternately disposed, and red, green and blue sub-pixels implement one pixel by means of the red, green and blue semiconductor light-emitting diodes, thereby implementing a full color display.

Figure 5B:
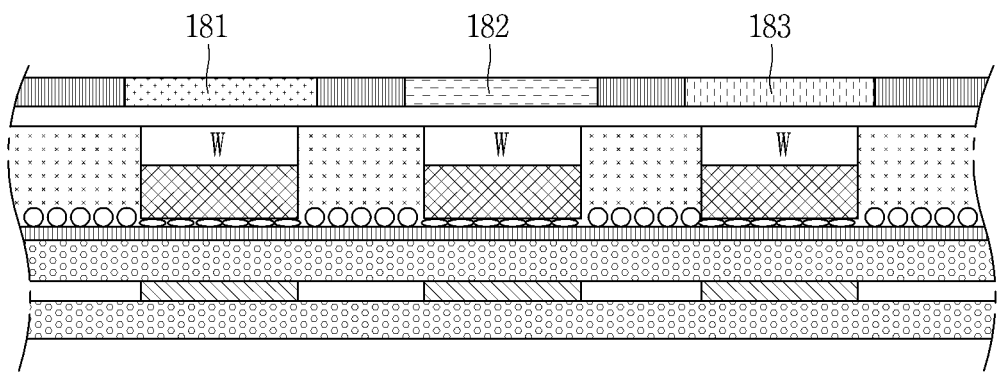

Referring to FIG. 5B, the semiconductor light-emitting diode may have a white light emitting device (W) provided with a yellow phosphor layer for each element. In this case, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
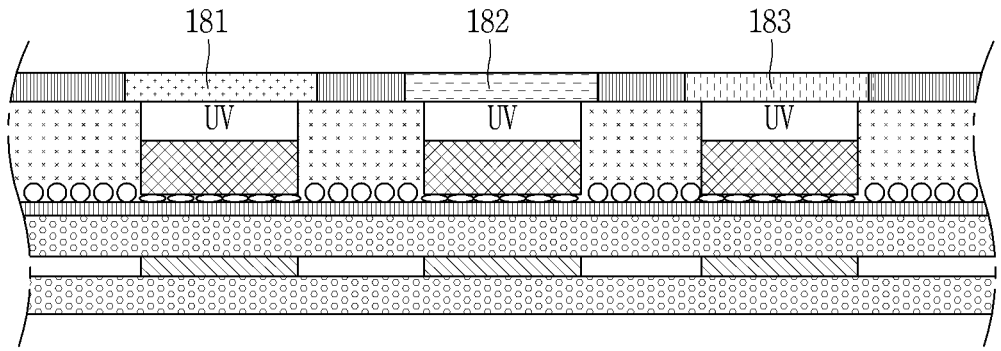

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light-emitting diode can be used over the entire region up to ultra violet (UV) as well as visible light, and may be extended to a form of semiconductor light-emitting diode in which ultra violet (UV) can be used as an excitation source.

Taking the present example into consideration again, the semiconductor light-emitting diode 150 is placed on the conductive adhesive layer 130 to configure a sub-pixel in the display device. The semiconductor light-emitting diode 150 may have excellent luminance characteristics, and thus it may be possible to configure individual sub-pixels even with a small size thereof. The size of the individual semiconductor light-emitting diode 150 may be less than 80 µm in the length of one side thereof, and formed with a rectangular or square shaped element. In case of a rectangular shaped element, the size thereof may be less than 20×80 µm.

Furthermore, even when a square shaped semiconductor light-emitting diode 150 with a length of side of 10 µm is used for a sub-pixel, it will exhibit a sufficient brightness for implementing a display device. Accordingly, for example, in case of a rectangular pixel in which one side of a sub-pixel is 600 µm in size, and the remaining one side thereof is 300 µm, a relative distance between the semiconductor light-emitting diodes becomes sufficiently large. Accordingly, in this case, it may be possible to implement a flexible display device having a HD image quality.

A display device using the foregoing semiconductor light-emitting diode will be fabricated by a new type of fabrication method. Hereinafter, the fabrication method will be described with reference to FIG. 6.

Figure 6:
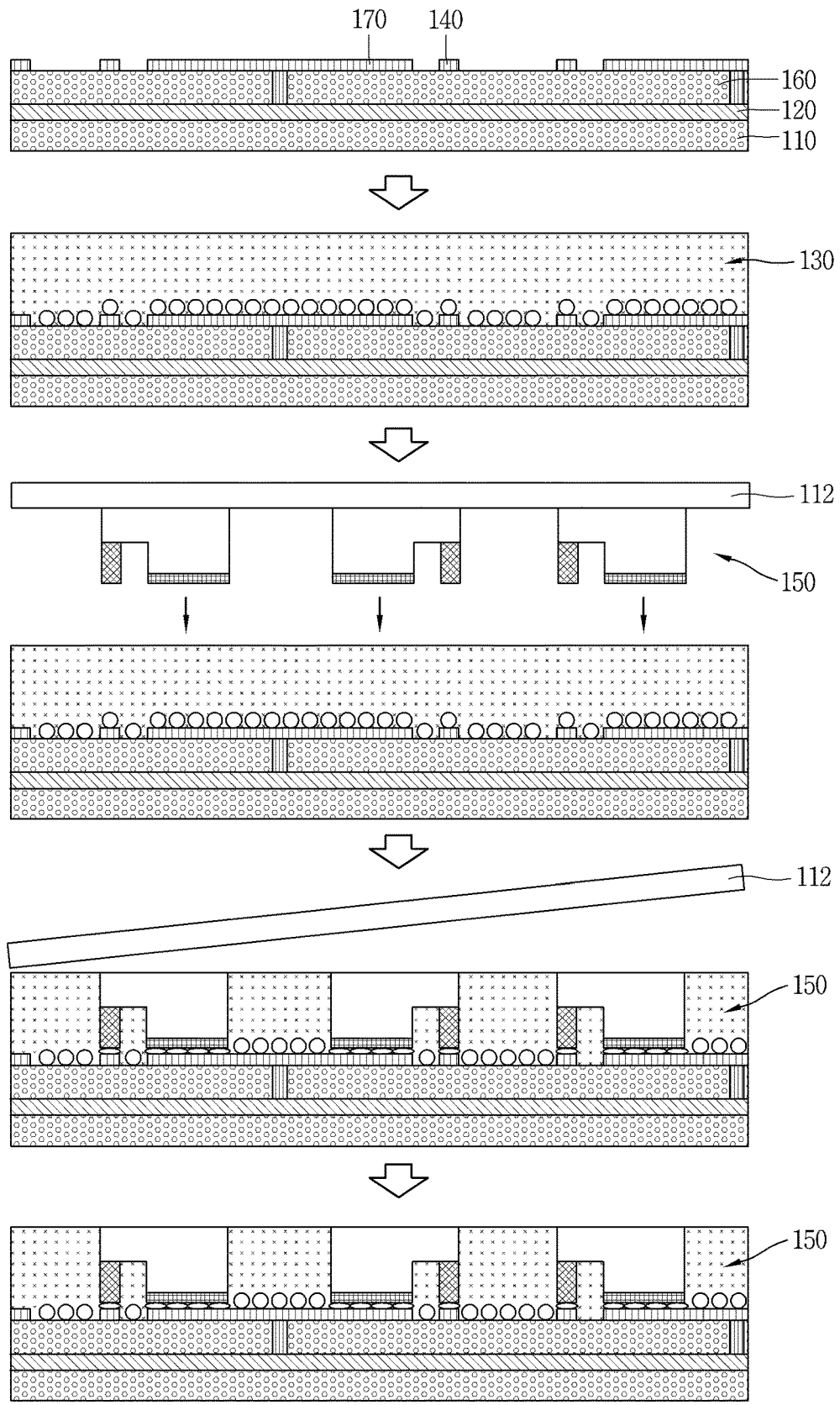
FIG. 6 is cross-sectional views illustrating a fabrication method of a display device using a semiconductor light-emitting diode according to the present disclosure.

FIG. 6 is cross-sectional views illustrating a fabrication method of a display device using a semiconductor light-emitting diode according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light-emitting diodes 150 corresponding to the location of the auxiliary electrodes 170 and second electrodes 140 and constituting individual pixels is disposed such that the semiconductor light-emitting diode 150 faces the auxiliary electrode 170 and second electrode 140.

In this case, the second substrate 112 as a growth substrate for growing the semiconductor light-emitting diode 150 may be a sapphire substrate or silicon substrate.

The semiconductor light-emitting diode may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light-emitting diode 150 and the auxiliary electrode 170 and second electrode 140 may have conductivity due to the characteristics of an anisotropic conductive film having conductivity by thermal compression, thereby allowing the electrodes and semiconductor light-emitting diode 150 to be electrically connected to each other. At this time, the semiconductor light-emitting diode 150 may be inserted into the anisotropic conductive film, thereby forming a partition wall between the semiconductor light-emitting diodes 150.

Next, the second substrate 112 is removed. For example, the second substrate 112 may be removed using a laser lift-off (LLO) or chemical lift-off (CLO) method.

Finally, the second substrate 112 is removed to expose the semiconductor light-emitting diodes 150 to the outside. Silicon oxide (SiOx) or the like may be coated on the wiring substrate coupled to the semiconductor light-emitting diode 150 to form a transparent insulating layer (not shown).

Furthermore, it may further include the process of forming a phosphor layer on one surface of the semiconductor light-emitting diode 150. For example, the semiconductor light-emitting diode 150 may be a blue semiconductor light-emitting diode for emitting blue (B) light, and red or green phosphor for converting the blue (B) light into the color of the sub-pixel may form a layer on one surface of the blue semiconductor light-emitting diode.

The fabrication method or structure of a display device using the foregoing semiconductor light-emitting diode may be modified in various forms. For such an example, the foregoing display device may be applicable to a vertical semiconductor light-emitting diode. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
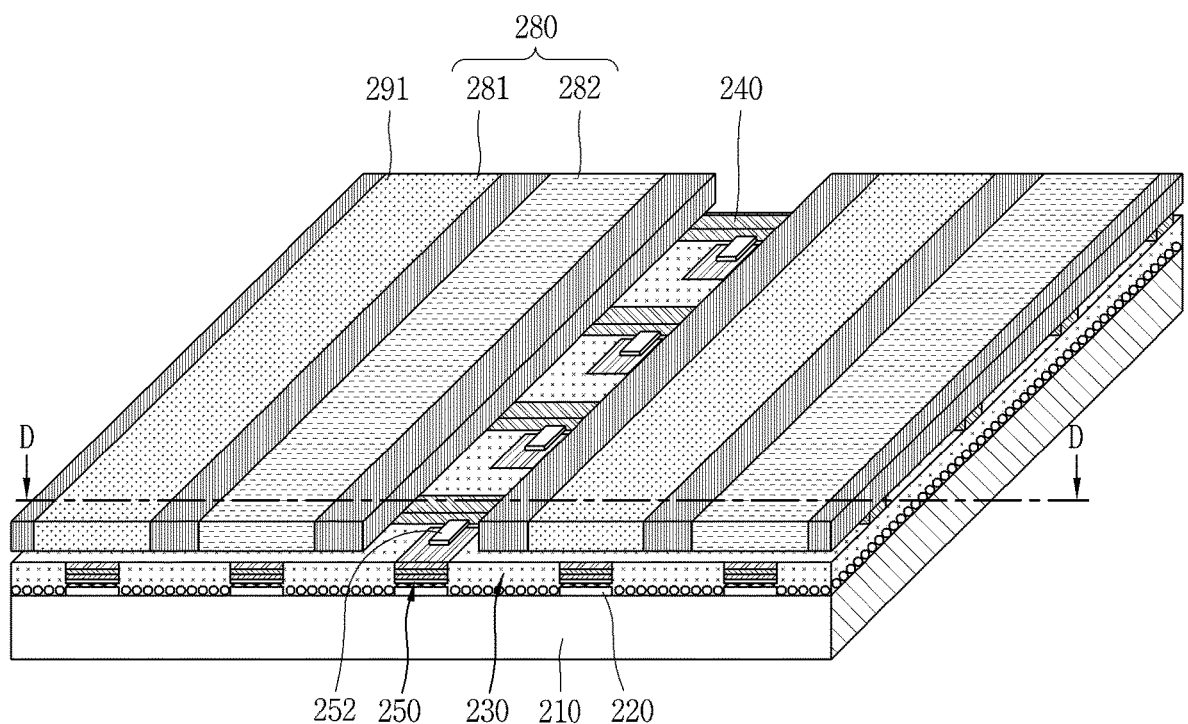
FIG. 7 is a perspective view illustrating a display device using a semiconductor light-emitting diode according to another embodiment of the present disclosure.
Figure 8:
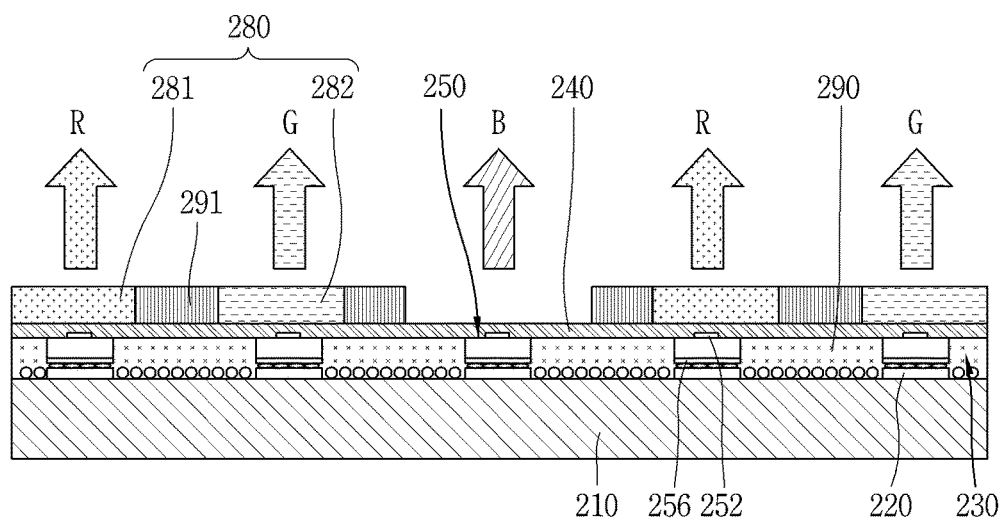
FIG. 8 is a cross-sectional view taken along line D-D in FIG. 7.
Figure 9:
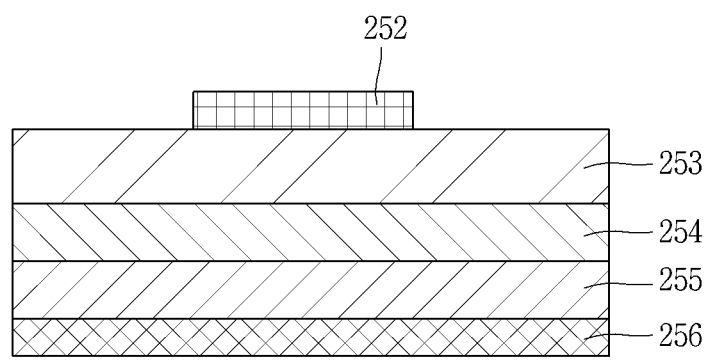
FIG. 9 is a conceptual view illustrating a vertical type semiconductor light-emitting diode in FIG. 8.

FIG. 7 is a perspective view illustrating a display device using a semiconductor light-emitting diode according to another embodiment of the present disclosure. FIG. 8 is a cross-sectional view taken along line C-C in FIG. 7, and FIG. 9 is a conceptual view illustrating a vertical type semiconductor light-emitting diode in FIG. 8.

According to the drawings, the display device may be display device using a passive matrix (PM) type of vertical semiconductor light-emitting diode.

The display device may include a substrate 210, a first electrode 220, a conductive adhesive layer 230, a second electrode 240 and a plurality of semiconductor light-emitting diodes 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light-emitting diode 250 thereto, the semiconductor light-emitting diode 250 is electrically connected to the first electrode 220. At this time, the semiconductor light-emitting diode 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light-emitting diode 250 and the first electrode 220.

In this manner, the semiconductor light-emitting diode 250 is placed on the conductive adhesive layer 230, thereby configuring a separate sub-pixel in the display device. The semiconductor light-emitting diode 250 may have excellent luminance characteristics, and thus it may be possible to configure individual sub-pixels even with a small size thereof. The size of the individual semiconductor light-emitting diode 250 may be less than 80 μm in the length of one side thereof, and formed with a rectangular or square shaped element. In case of a rectangular shaped element, the size thereof may be less than 20×80 μm.

The semiconductor light-emitting diode 250 may be a vertical structure.

A plurality of second electrodes 240 disposed in a direction of crossing the length direction of the first electrode 220, and electrically connected to the vertical semiconductor light-emitting diode 250 may be located between vertical semiconductor light-emitting diodes.

Referring to FIG. 9, the vertical semiconductor light-emitting diode may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light-emitting diode 250, thereby providing a great advantage capable of reducing the chip size.

Referring again to FIG. 8, a phosphor layer 280 may be formed on one surface of the semiconductor light-emitting diode 250. For example, the semiconductor light-emitting diode 250 is a blue semiconductor light-emitting diode 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light-emitting diode 251 at a location implementing a red sub-pixel, and a green phosphor 282 capable of converting blue light into green (G) light may be deposited on the blue semiconductor light-emitting diode 251 at a location implementing a green sub-pixel. Furthermore, only the blue semiconductor light-emitting diode 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which a flip chip type light emitting device is applied.

Taking the present embodiment into consideration again, the second electrode 240 is located between the semiconductor light-emitting diodes 250, and electrically connected to the semiconductor light-emitting diodes 250. For example, the semiconductor light-emitting diodes 250 may be disposed in a plurality of rows, and the second electrode 240 may be located between the rows of the semiconductor light-emitting diodes 250.

Since a distance between the semiconductor light-emitting diodes 250 constituting individual pixels is sufficiently large, the second electrode 240 may be located between the semiconductor light-emitting diodes 250.

The second electrode 240 may be formed with a bar-shaped electrode elongated in one direction, and disposed in a perpendicular direction to the first electrode.

Furthermore, the second electrode 240 may be electrically connected to the semiconductor light-emitting diode 250 by a connecting electrode protruded from the second electrode 240. More specifically, the connecting electrode may be an n-type electrode of the semiconductor light-emitting diode 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light-emitting diode 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light-emitting diode 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light-emitting diode 250, the ITO material has a problem of bad adhesiveness with an n-type semiconductor. Accordingly, the second electrode 240 may be placed between the semiconductor light-emitting diodes 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light-emitting diodes 250. In other words, the partition wall 290 may be disposed between the vertical semiconductor light-emitting diodes 250 to isolate the semiconductor light-emitting diode 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light-emitting diode 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this case, the partition wall 290 may include a black or white insulator according to the purpose of the display device.

If the second electrode 240 is precisely located on the conductive adhesive layer 230 between the semiconductor light-emitting diodes 250, the partition wall 290 may be located between the semiconductor light-emitting diode 250 and second electrode 240. Accordingly, individual sub-pixels may be configured even with a small size using the semiconductor light-emitting diode 250, and a distance between the semiconductor light-emitting diodes 250 may be relatively sufficiently large to place the second electrode 240 between the semiconductor light-emitting diodes 250, thereby having the effect of implementing a flexible display device having a HD image quality.

Furthermore, according to the drawing, a black matrix 291 may be disposed between each phosphor layer to enhance contrast. In other words, the black matrix 291 can enhance the contrast of luminance.

As described above, the semiconductor light-emitting diode 250 is located on the conductive adhesive layer 230, thereby constituting individual pixels on the display device. The semiconductor light-emitting diode 250 may have excellent luminance characteristics, and thus it may be possible to configure individual sub-pixels even with a small size thereof. As a result, it may be possible to implement a full color display in which the sub-pixels of red (R), green (G) and blue (B) implement one pixel by means of the semiconductor light-emitting diode.

In a display device using the foregoing semiconductor light-emitting diode of the present disclosure, when a flip chip type is applied thereto, the first and second electrodes are disposed on the same plane, thereby causing a problem in which it is difficult to realize a fine pitch. Hereinafter, a display device to which a flip chip type light emitting device according to another embodiment of the present disclosure capable of solving such a problem is applied will be described.

Figure 10:
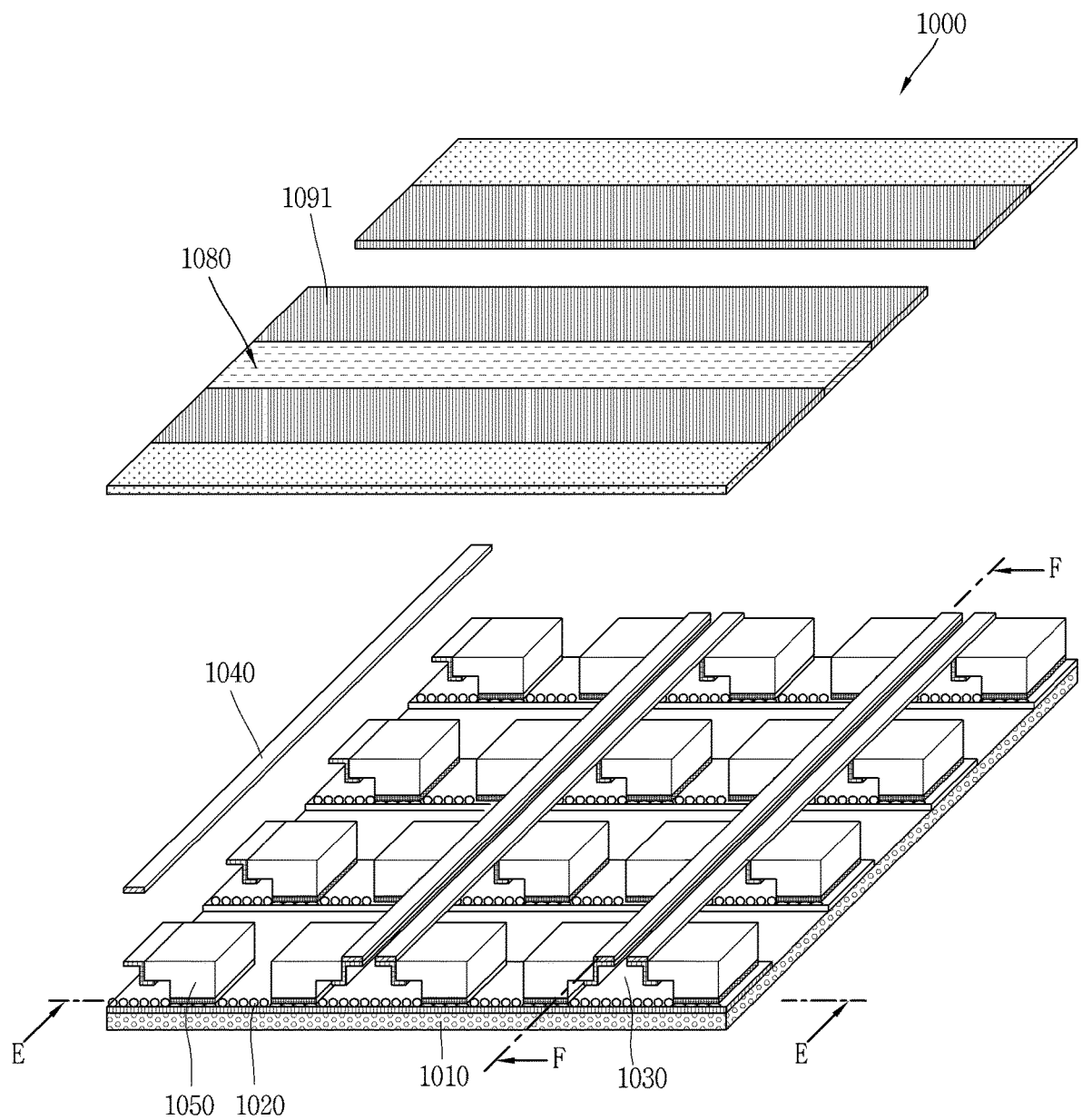
FIG. 10 is an enlarged view of portion "A" in FIG. 1 for explaining another embodiment of the present disclosure to which a semiconductor light-emitting diode having a new structure is applied.
Figure 11A:
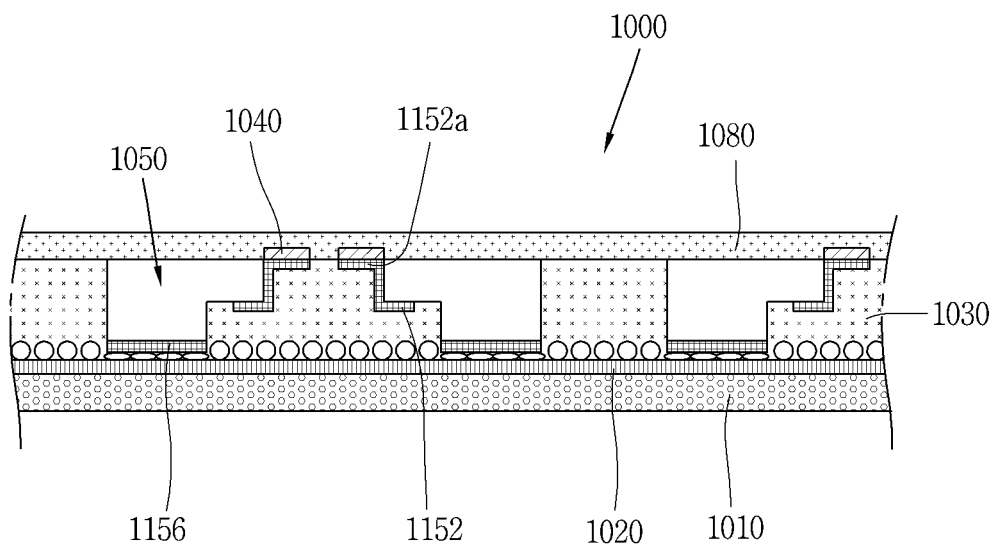
FIG. 11A is a cross-sectional view taken along line E-E in FIG. 10.
Figure 11B:
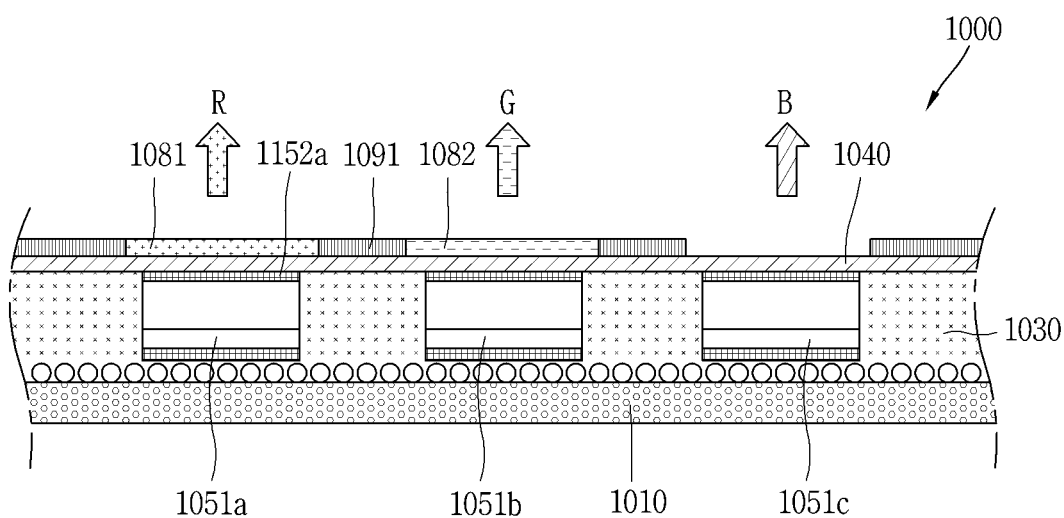
FIG. 11B is a cross-sectional view taken along line F-F in FIG. 11.
Figure 12:
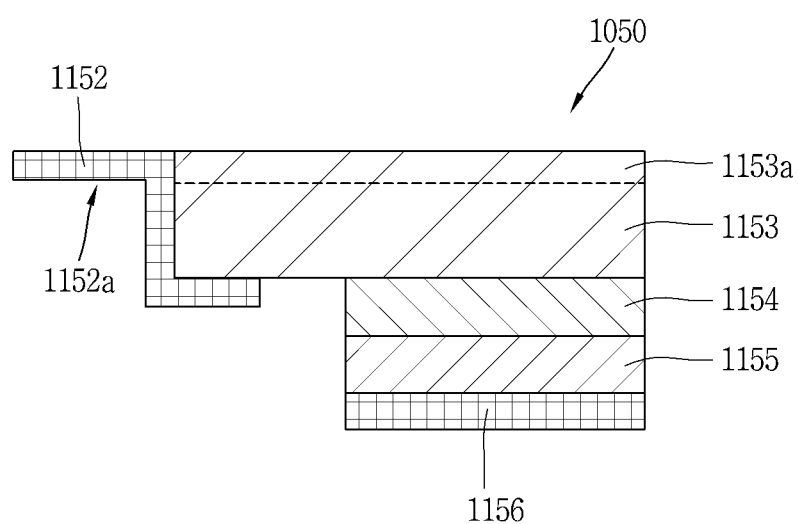
FIG. 12 is a conceptual view illustrating a flip chip type semiconductor light-emitting diode in FIG. 11A.

FIG. 10 is an enlarged view of portion "A" in FIG. 1 for explaining another embodiment of the present disclosure to which a semiconductor light-emitting diode having a new structure is applied, FIG. 11A is a cross-sectional view taken along line E-E in FIG. 10, FIG. 11B is a cross-sectional view taken along line F-F in FIG. 11, and FIG. 12 is a conceptual view illustrating a flip chip type semiconductor light-emitting diode in FIG. 11A.

According to the drawings in FIGS. 10, 11A and 11B, there is illustrated a display device 1000 using a passive matrix (PM) type semiconductor light-emitting diode as a display device 1000 using a semiconductor light-emitting diode. However, an example described below may also be applicable to an active matrix (AM) type semiconductor light-emitting diode.

The display device 1000 may include a substrate 1010, a first electrode 1020, a conductive adhesive layer 1030, a second electrode 1040, and a plurality of semiconductor light-emitting diodes 1050. Here, the first electrode 1020 and the second electrode 1040 may respectively include a plurality of electrode lines.

The substrate 1010 as a wiring substrate disposed with the first electrode 1020 may include polyimide (PI) to implement a flexible display device. In addition, any one may be used if it is an insulating and flexible material.

The first electrode 1020 may be located on the substrate 1010, and formed with a bar-shaped electrode elongated in one direction. The first electrode 1020 may be formed to perform the role of a data electrode.

The conductive adhesive layer 1030 is formed on the substrate 1010 located with the first electrode 1020. Similarly to a display device to which the foregoing flip chip type light emitting device is applied, the conductive adhesive layer 1030 may be an anisotropic conductive film (ACF), an anisotropic conductive paste, a solution containing conductive particles, and the like. However, in the present embodiment, the conductive adhesive layer 1030 may be replaced with an adhesive layer. For example, when the first electrode 1020 is not located on the substrate 1010 but formed integrally with the conductive electrode of the semiconductor light-emitting diode, the adhesive layer may not need to have conductivity.

A plurality of second electrodes 1040 disposed in a direction of crossing the length direction of the first electrode 1020, and electrically connected to the semiconductor light-emitting diode 1050 may be located between the semiconductor light-emitting diodes.

According to the drawing, the second electrode 1040 may be located on the conductive adhesive layer 1030. In other words, the conductive adhesive layer 1030 is disposed between the wiring substrate and the second electrode 1040. The second electrode 1040 may be electrically connected by contact with the semiconductor light-emitting diode 1050.

A plurality of semiconductor light-emitting diodes 1050 are coupled to the conductive adhesive layer 1030, and electrically connected to the first electrode 1020 and the second electrode 1040 by the foregoing structure.

According to circumstances, a transparent insulating layer (not shown) containing silicon oxide (SiOx) may be formed on the substrate 1010 formed with the semiconductor light-emitting diode 1050. When the transparent insulating layer is formed and then the second electrode 1040 is placed thereon, the second electrode 1040 may be located on the transparent insulating layer. Furthermore, the second electrode 1040 may be formed to be separated from the conductive adhesive layer 1030 or transparent insulating layer.

As shown in the drawing, the plurality of semiconductor light-emitting diodes 1050 may form a plurality of columns in a direction parallel to a plurality of electrode lines provided in the first electrode 1020. However, the present disclosure is not necessarily limited thereto. For example, the plurality of semiconductor light-emitting diodes 1050 may form a plurality of columns along the second electrode 1040.

Moreover, the display device 1000 may further include a phosphor layer 1080 formed on one surface of the plurality of semiconductor light-emitting diodes 1050. For example, the semiconductor light-emitting diode 1050 is a blue semiconductor light-emitting diode that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light may be deposited on the blue semiconductor light-emitting diode 1051a at a location implementing a red sub-pixel, and a green phosphor 1082 capable of converting blue light into green (G) light may be deposited on the blue semiconductor light-emitting diode 1051b at a location implementing a green sub-pixel. Furthermore, only the blue semiconductor light-emitting diode 1051c may be solely used at a location implementing a blue sub-pixel. In this case, the red (R), green (G) and blue (B) sub-pixels may implement one pixel. More specifically, one color phosphor may be deposited along each line of the first electrode 1020. Accordingly, one line on the first electrode 1020 may be an electrode controlling one color. In other words, red (R), green (B) and blue (B) may be sequentially disposed along the second electrode 1040, thereby implementing sub-pixels. However, the present disclosure may not be necessarily limited to this, and the semiconductor light-emitting diode 1050 may be combined with a quantum dot (QD) instead of a phosphor to implement sub-pixels that emit red (R), green (G) and blue (B).

On the other hand, in order to improve the contrast of the phosphor layer 1080, the display device may further include a black matrix 1091 disposed between each phosphor. The black matrix 1091 may be formed in such a manner that a gap is formed between the phosphor dots and a black material fills the gap. Through this, the black matrix 1091 may improve contrast between light and dark while absorbing external light reflection. The black matrix 1091 is located between respective phosphor layers along the first electrode 1020 in a direction in which the phosphor layers 1080 are layered. In this case, a phosphor layer may not be formed at a position corresponding to the blue semiconductor light-emitting diode 1051, but the black matrix 1091 may be respectively formed at both sides thereof by interposing a space that does not have the blue light emitting device 1051c therebetween.

Meanwhile, referring to the semiconductor light-emitting diode 1050 according to the present example, the electrodes may be disposed in an upward/downward direction in the semiconductor light-emitting diode 1050 in the present embodiment, thereby having a great advantage capable of reducing the chip size. However, the electrode may be disposed on the top and the bottom, but the semiconductor light-emitting diode may be a flip chip type semiconductor light-emitting diode.

Referring to FIG. 12, the semiconductor light-emitting diode 1050 includes a first conductive electrode 1156, a first conductive semiconductor layer 1155 formed with the first conductive electrode 1156, an active layer 1154 formed on the first conductive semiconductor layer 1155, a second conductive semiconductor layer 1153 formed on the active layer 1154, and a second conductive electrode 1152 formed on the second conductive semiconductor layer 1153.

More specifically, the first conductive electrode 1156 and the first conductive semiconductor layer 1155 may be a p-type electrode and a p-type semiconductor layer, respectively, and the second conductive electrode 1152 and the second conductive semiconductor layer 1153 may be an n-type electrode and an n-type semiconductor layer, respectively. However, the present disclosure is not limited thereto, and the first conductive type may be n-type and the second conductive type may be p-type.

More specifically, the first conductive electrode 1156 is formed on one surface of the first conductive semiconductor layer 1155, and the active layer 1154 is formed on the other surface of the first conductive semiconductor layer 1155 and one surface of the second conductive semiconductor layer 1153, and the second conductive electrode 1152 is formed on one surface of the second conductive semiconductor layer 1153.

In this case, the second conductive electrode is disposed on one surface of the second conductive semiconductor layer 1153, and an undoped semiconductor layer 1153a is formed on the other surface of the second conductive semiconductor layer 1153.

Referring to FIG. 12 together with FIGS. 10 through 11B, one surface of the second conductive semiconductor layer may be a surface closest to the wiring substrate, and the other surface of the second conductive semiconductor layer may be a surface farthest from the wiring substrate.

Furthermore, the first conductive electrode 1156 and the second conductive electrode 1152 may have a height difference from each other in width and vertical directions (or thickness direction) at positions spaced apart along the width direction of the semiconductor light-emitting diode.

The second conductive electrode 1152 is formed on the second conductive semiconductor layer 1153 using the height difference, but disposed adjacent to the second electrode 1040 located at an upper side of the semiconductor light-emitting diode. For example, at least part of the second conductive electrode 1152 may protrude from a side surface of the second conductive semiconductor layer 1153 (or a side surface of the undoped semiconductor layer 1153a). As described above, since the second conductive electrode 1152 protrudes from the side surface, the second conductive electrode 1152 may be exposed to an upper side of the semiconductor light-emitting diode. Through this, the second conductive electrode 1152 is disposed at a position overlapping the second electrode 1040 disposed at an upper side of the conductive adhesive layer 1030.

More specifically, the semiconductor light-emitting diode includes a protruding portion 1152a extending from the second conductive electrode 1152, and protruding from a side surface of the plurality of semiconductor light-emitting diodes. In this case, referring to the protruding portion 1152a as a reference, the first conductive electrode 1156 and the second conductive electrode 1152 are disposed at positions spaced apart along the protruding direction of the protruding portion 1152a, and may be expressed such that they are formed to have a height difference from each other in a direction perpendicular to the protruding direction.

The protruding portion 1152a extends laterally from one surface of the second conductive semiconductor layer 1153, and extends to an upper surface of the second conductive semiconductor layer 1153, and more specifically, to the undoped semiconductor layer 1153a. The protruding portion 1152a protrudes along the width direction from a side surface of the undoped semiconductor layer 1153a. Accordingly, the protruding portion 1152a may be electrically connected to the second electrode 1040 on the opposite side of the first conductive electrode with respect to the second conductive semiconductor layer.

A structure including the protruding portion 1152a may be a structure capable of using the above-described horizontal semiconductor light-emitting diode and vertical semiconductor light-emitting diode. On the other hand, fine grooves may be formed by roughing on an upper surface farthest from the first conductive electrode 1156 on the undoped semiconductor layer 1153a.

According to the above-described display device of the present disclosure it is difficult to increase the luminance of the display device due to a small size of the semiconductor light-emitting diode. This is because there is restriction in increasing luminance since the area of an upper surface on which light is emitted from the semiconductor light-emitting diode is small. In addition, since the micro semiconductor light-emitting diode is a point light source, there is a disadvantage that uniformity is lowered in the related art.

The present disclosure proposes a new mechanism for solving the foregoing disadvantage. Hereinafter, a display device to which a new mechanism is applied will be described.

Figure 13:
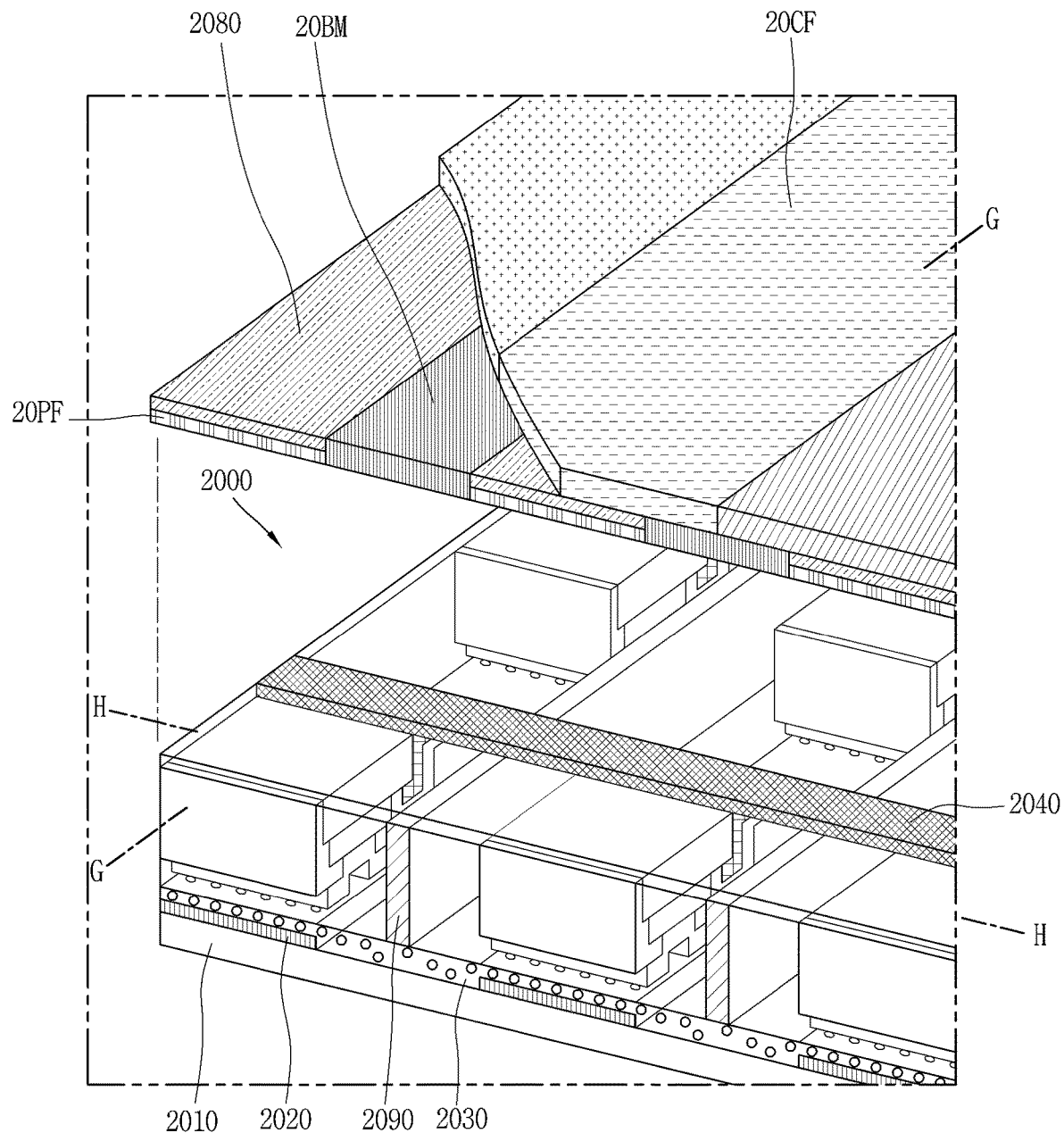
FIG. 13 is a partial perspective view for explaining another embodiment of the present disclosure.
Figure 14:
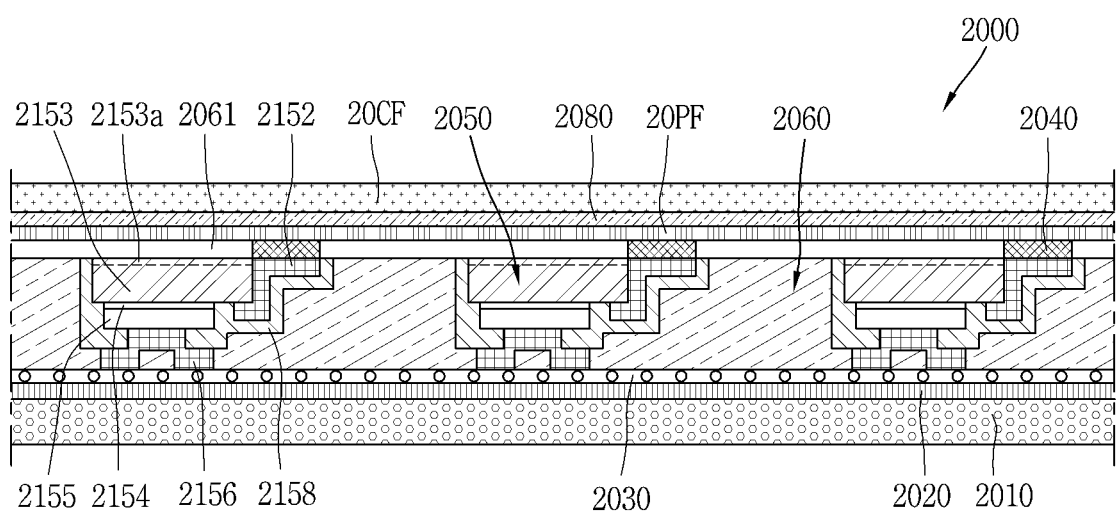
FIG. 14 is a cross-sectional view taken along line G-G in FIG. 13.
Figure 15:
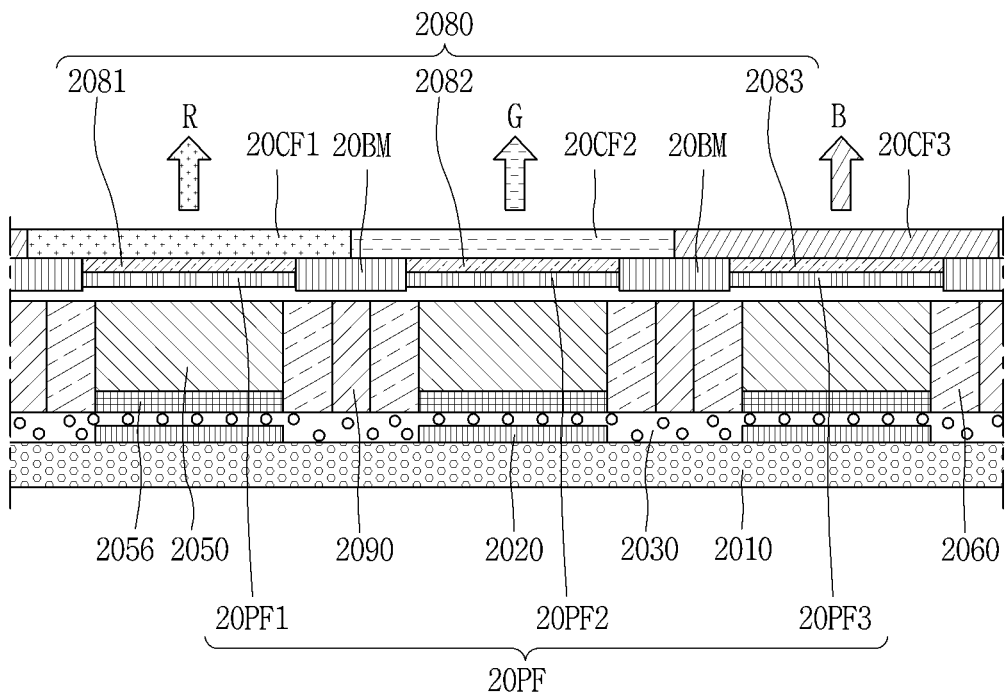
FIG. 15 is a cross-sectional view taken along line H-H in FIG. 13.

Hereinafter, the structure of a display device of the present disclosure will be described in detail with reference to the accompanying drawings. FIG. 13 is a partial perspective view for explaining another embodiment of the present disclosure, and FIG. 14 is a cross-sectional view taken along line G-G in FIG. 13, and FIG. 15 is a cross-sectional view taken along line H-H in FIG. 13.

According to the drawings in FIGS. 13, 14 and 15, there is illustrated a case where a mechanism for increasing luminance is added to flip chip type semiconductor light-emitting diodes described with reference to FIGS. 10 through 12 as a display device using semiconductor light-emitting diodes. However, an example described below is also applicable to a display device using another type of semiconductor light-emitting diode described above with reference to FIGS. 1 through 9. Furthermore, in the present example to be described below, the same or similar reference numerals are designated to the same or similar components as those of the example described above with reference to FIGS. 10 through 12, and the description thereof will be substituted by the earlier description.

According to the illustration, the semiconductor light-emitting diode 2050 includes a first conductive electrode 2156, a first conductive semiconductor layer 2155 formed with the first conductive electrode 2156, an active layer 2154 formed on the first conductive semiconductor layer 2155, a second conductive semiconductor layer 2153 formed on the active layer 2154, and a second conductive electrode 2152 formed on the second conductive semiconductor layer 2153, and the description thereof will be substituted by the description with reference to FIG. 12.

As described above with reference to FIG. 12, a protruding portion 2152a extends laterally from one surface of the second conductive semiconductor layer 2153, and extends to an upper surface of the second conductive semiconductor layer 2153, and more specifically, to the undoped semiconductor layer 2153a. Accordingly, the protruding portion 2152a may be electrically connected to the second electrode 2040 on the opposite side of the first conductive electrode 2156 with respect to the second conductive semiconductor layer 2153. Furthermore, in this case, a passivation layer 2158 may be provided to surround an outer surface of the semiconductor light-emitting diode.

The display device 2000 may include a substrate 2010, a first electrode 2020, a second electrode 2040, a conductive adhesive layer 2030, and a plurality of semiconductor light-emitting diodes 2050.

The substrate 2010 may be a wiring substrate disposed with the first electrode 2020, and thus the first electrode 2020 may be a wiring electrode positioned on the substrate 2010. In this case, according to circumstances, the substrate 2010 may be formed of an insulating but non-flexible material. Furthermore, the substrate 2010 may be either one of transparent and non-transparent materials.

Referring to these drawings, the conductive adhesive layer 2030 electrically connects the substrate 2010 and the semiconductor light-emitting diodes 2050 while attaching the semiconductor light-emitting diodes 2050 to the substrate 2010 (wiring substrate). In this case, the conductive adhesive layer 2030 may be an anisotropic conductive film.

However, the present disclosure is not limited thereto, and the conductive adhesive layer 2030 may be replaced with a low melting point portion made of a material having a lower melting point than the wiring electrode of the wiring substrate. For such an example, the low melting point portion may be plated on the first electrode 2020 with a solder material, and combined with the first conductive electrode 2156 of the semiconductor light-emitting diodes 2050. The solder material may be at least one of Sb, Pd, Ag, Au and Bi, for example. In this case, solder may be deposited on the first electrode 2020 of the wiring substrate, and soldering may be carried out using thermal energy.

According to the illustration, an insulating layer 2060 may be deposited on the conductive adhesive layer 2030. In a structure in which a solder material connects the first electrode 2020 and the first conductive electrode 2156, the insulating layer 2060 may be deposited on an upper side of the wiring substrate.

In this case, the insulating layer 2060 is formed to fill between the semiconductor light-emitting diodes. More specifically, the insulating layer 2060 may be formed of an insulating material such as polyimide (PI), PET, PEN, or the like.

The insulating layer 2060 may be formed of the same material as an insulating base member of the conductive adhesive layer 2030. In this case, the insulating layer 2060 and the conductive adhesive layer 2030 may be integrated by bonding, and accordingly, the insulating layer 2060 may be integrated with the substrate 2010 while filling between the semiconductor light-emitting diodes to form a single substrate.

According to the illustration, a second electrode electrically connecting the plurality of semiconductor light-emitting diodes may be formed along one direction on one surface of the insulating layer 2060.

The second electrode 2040 may be positioned on the insulating layer 2060 and may be the wiring electrode. The second electrode 2040 is extended toward a neighboring semiconductor light-emitting diode to connect the plurality of semiconductor light-emitting diodes to each other, thereby functioning as an upper wiring.

In this case, the insulating layer 2060 is disposed between the wiring substrate and the second electrode 2040. The second electrode 2040 may be electrically connected to the semiconductor light-emitting diode 2050 by contact, and may be operated as a scan electrode for transmitting a scan signal. However, the present disclosure is not limited thereto, and the first electrode 2020 may be a scan electrode, and the second electrode 2040 may be a data electrode.

According to the drawing, a partition wall 2090 may be formed between the semiconductor light-emitting diodes 2050. In this case, the partition wall 2090 may perform the role of dividing individual sub-pixels from one another, and be formed as an integral body with the insulating layer 2060. Furthermore, the insulating layer may be partitioned by a partition wall disposed between the semiconductor light-emitting diodes. For example, it may be a structure in which the semiconductor light-emitting diode 2050 and the partition wall are inserted into the resin of the insulating layer 2060.

The partition wall 2090 may be a reflective partition wall In this case, the partition wall 2090 may include a black or white insulator according to the purpose of the display device. It may have an effect of enhancing reflectivity when the partition wall of the while insulator is used, and increase contrast while at the same time having reflective characteristics.

In this case, the partition wall 2090 may be formed along each line of the first electrode 2020. Accordingly, one line on the first electrode 2020 may be an electrode controlling one color. In this case, the partition walls 2090 may be respectively disposed on both sides of the semiconductor light-emitting diode isolated along the second electrode 2040. Furthermore, red (R), green (B) and blue (B) may be sequentially disposed along the second electrode 2040, thereby implementing sub-pixels.

In order to implement the red (R), green (G), and blue (B), the display device 2000 further includes a wavelength conversion layer 2080 formed on one surface of a plurality of semiconductor light-emitting diodes 2050. The wavelength conversion layer 2080 is configured to convert the wavelength of light.

For example, the semiconductor light-emitting diode 2050 is a blue semiconductor light-emitting diode that emits blue (B) light, and the wavelength conversion layer 2080 performs a function of converting the blue (B) light into the wavelength of another color. However, the present disclosure is not limited thereto, and the semiconductor light-emitting diode 2050 may be a green semiconductor light-emitting diode that emits green (G) light. For such an example, the wavelength conversion layer 2080 may be a fluorescent filter having a yellow phosphor. When a phosphor is filled into the position of the insulating layer, the mass productivity is reduced by the printing residue or the thickness deviation. On the contrary, according to the fluorescent filter as shown in the present example, the mass productivity may be increased during the manufacture of the display.

In this case, light output from the semiconductor light-emitting diodes 2050 is excited using the yellow phosphor to convert the wavelength.

More specifically, the wavelength conversion layer 2080 may include a plurality of phosphor portions 2081, 2082, 2083 that overlap with the plurality of semiconductor light-emitting diodes, respectively. The plurality of phosphor portions 2081, 2082, 2083 may be formed in a bar shape along the first electrode as phosphor portions corresponding to red (R), green (G), and blue (B), respectively, and sequentially arranged along the second electrode. At this time, a black matrix 20BM may be disposed between the phosphor portions 2081, 2082, 2083. The black matrix 20BM may be formed in a bar shape along the first electrode 2020 similarly to the phosphor portions and disposed on both sides of the phosphor portion along the second electrode. The black matrix 20BM performs the role of partitioning the wavelength conversion layer into a plurality of phosphor portions.

Meanwhile, the foregoing partition wall 2090 may be formed at a position corresponding to the black matrix 20BM. At this time, the black matrix 20BM has a cross-sectional area larger than that of the partition wall 2090, thereby limiting the partition wall 2090 from being exposed to the outside in the display.

In the present example, each of the phosphor portions 2081, 2082, 2083 may be filled with a yellow phosphor. However, the present disclosure is not limited thereto, and the wavelength conversion layer 2080 may have a structure in which a red phosphor portion, a green phosphor portion, and a blue phosphor portion are sequentially arranged.

Referring to these drawings, a polarizing filter layer 20PF for filtering light incident in a specific direction may be overlapped with the insulating layer 2060. An adhesive layer 2061 may be formed between the polarizing filter layer 20PF and the insulating layer 2060. The adhesive layer 2061 may be a light-transmitting adhesive layer having excellent optical performance such as an optical adhesive film (OCA) or an optical adhesive resin (OCR). According to such a structure, the light may spread more widely due to a refractive index difference between the polarizing filter layer 20PF and the adhesive layer 2061.

At this time, the black matrix 20BM may be at least partially protruded from the polarizing filter layer 20PF toward the semiconductor light-emitting diode. Since the black matrix 20BM is protruded and inserted into the adhesive layer, the black matrix may function as an anchor to be stuck on the adhesive layer, thereby improving adhesive force.

Furthermore, the polarizing filter layer 20PF may overlap with the wavelength conversion layer 2080. More specifically, the polarizing filter layer 20PF may be disposed between the insulating layer 2060 and the wavelength conversion layer 2080 along a thickness direction of the wavelength conversion layer 2080.

The polarizing filter layer 20PF may include a plurality of polarizers 20PF1, 20PF2, 20PF3 sequentially disposed along one direction so as to overlap with the plurality of semiconductor light-emitting diodes.

For example, the plurality of polarizers 20PF1, 20PF2, 20PF3 may be formed in a bar shape along the first electrode 2020 as polarizers corresponding to red (R), green (G), and blue (B) pixels, respectively, and sequentially arranged along the second electrode 2040. In this case, fine grooves due to texturing or roughing may be formed on the incident surfaces of the polarizers 20PF1, 20PF2, 20PF3.

At this time, a black matrix 20BM is disposed between the polarizers 20PF1, 20PF2, 20PF3 to function as a partition wall between the polarizers 20PF1, 20PF2, 20PF3.

In other words, black matrices 20BM are disposed between the plurality of polarizers 20PF1, 20PF2, 20PF3 along the one direction, thereby allowing the wavelength conversion layer 2080 and the polarization filter layer 20PF to form a plurality of layers overlapping with each other between the black matrices 20BM. The black matrices 20BM may form a common partition wall between the polarizing filter layer 20PF and the wavelength conversion layer 2080, and thus the polarizers 20PF1, 20PF2, 20PF3 may have the same width as the phosphor portions 2081, 2082, 2083, respectively.

The structure described above may be manufactured by patterning a black matrix on a substrate such as a glass, then coating a phosphor first, and then coating a polarizing material. Furthermore, according to such a structure, as the fluorescent filter and the polarizing filter are integrally provided and arranged inside the black matrix, the crosstalk may be alleviated to improve the image quality.

Meanwhile, according to the illustration, the color conversion layer 2080 overlaps with the color filter 20CF to implement red, green, and blue colors. More specifically, the color filter 20CF and the wavelength conversion layer 2080 may be combined by adhesion. In this case, the color filter 20CF is made to selectively transmit light to implement red, green and blue colors. The color filter 20CF may be provided with a plurality of filtering portions for filtering a red wavelength, a green wavelength, and a blue wavelength, and may have a structure in which the plurality of filtering portions 20CF1, 20CF2, 20CF3 are repeatedly arranged. At this time, a red filtering portion 20CF1, a green filtering portion 20CF2, and a blue filtering portion 20CF3 for filtering red, green, and blue colors may be respectively arranged on an upper side of the phosphor portions continuing along the second electrode. In this case, the wavelength conversion layer 2080 is combined with the color filter 20CF to implement the unit pixels of red, green, and blue.

According to the structure described above, since the fluorescent filter and the polarizing filter are integrally formed to polarize and then excite light, and filter it into red, green, and blue, the display may emit light closer to a surface light source. Through this, the image quality of the display may be improved.

Meanwhile, a display device using the semiconductor light-emitting diode described above may be modified into various forms. Hereinafter, these modified examples will be described.

Figure 16:
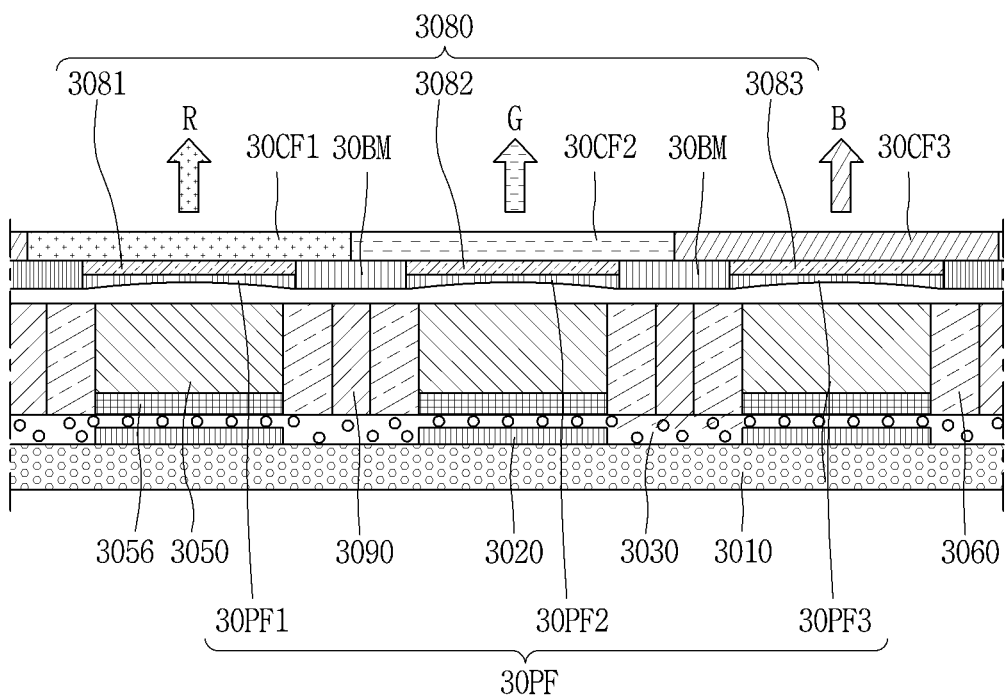
FIGS. 16 and 17 are cross-sectional views for explaining other embodiments of the present disclosure.
Figure 17:
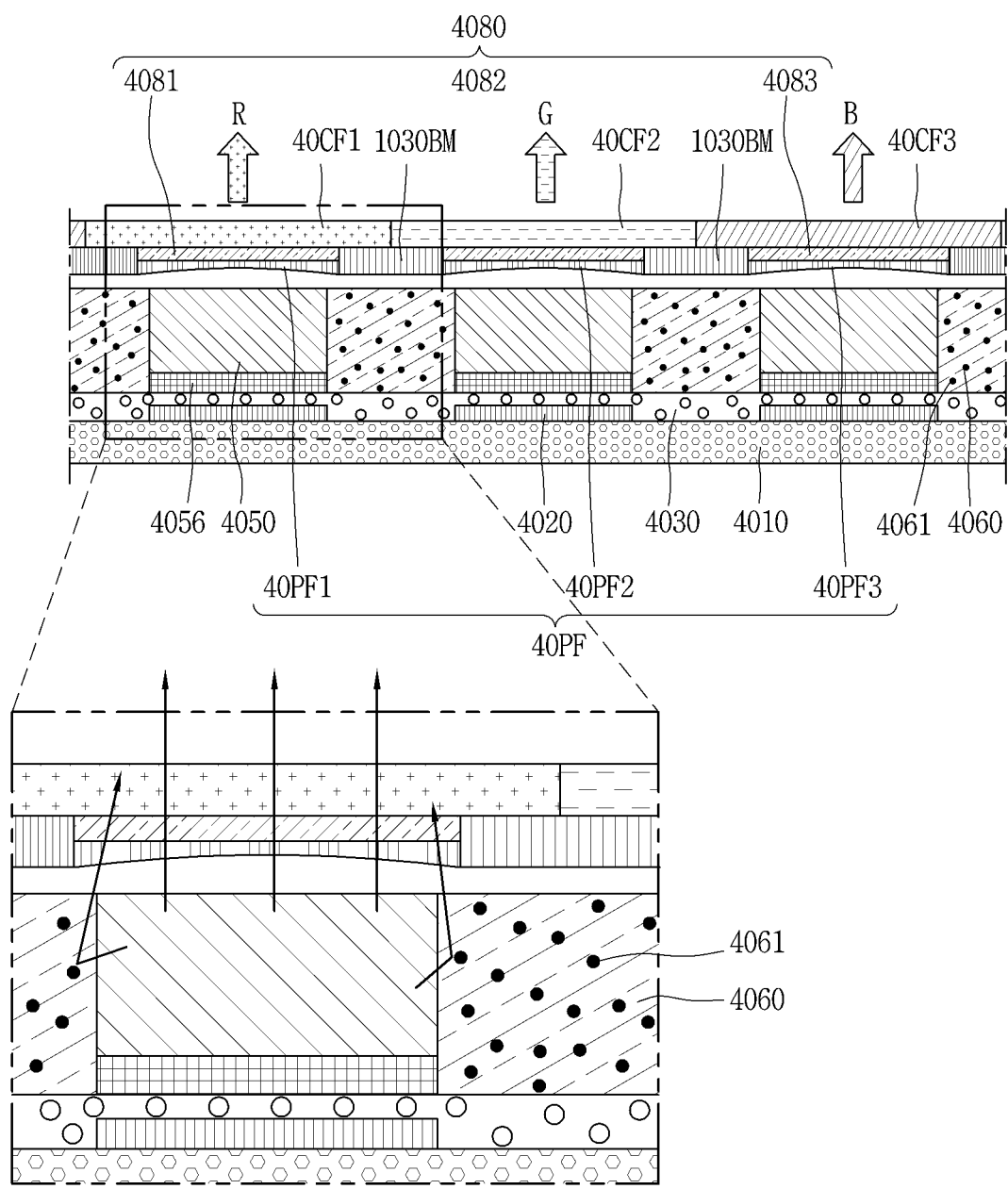

FIGS. 16 and 17 are cross-sectional views for explaining other embodiments of the present disclosure.

According to the drawing of FIG. 16, as a display device using semiconductor light-emitting diodes, there is illustrated a case to which flip chip type semiconductor light-emitting diodes described with reference to FIGS. 13 through 15 are applied. However, an example described below is also applicable to a display device using another type of semiconductor light-emitting diode described above with reference to FIGS. 1 through 9. Furthermore, in the present example to be described below, the same or similar reference numerals are designated to the same or similar components as those of the example described above with reference to FIGS. 13 through 15, and the description thereof will be substituted by the earlier description.

According to the illustration, the semiconductor light-emitting diode 3050 includes a first conductive electrode 3156, a first conductive semiconductor layer formed with the first conductive electrode 3156, an active layer formed on the first conductive semiconductor layer, a second conductive semiconductor layer on the active layer, and a second conductive electrode formed on the second conductive semiconductor layer, and the description thereof will be substituted by the description with reference to FIG. 12.

The display device 3000 includes a substrate 3010, a first electrode 3020, a second electrode 3040, a conductive adhesive layer 3030, an insulating layer 3060, a partition wall 3090, a wavelength conversion layer 3080, a color filter 30CF and a plurality of semiconductor light-emitting diodes 3050. These structures and functions are the same as those of the display device described above with reference to FIGS. 13 through 15, and therefore, the description thereof will be substituted by the foregoing description.

Referring to the present drawing, a polarizing filter layer 30PF for filtering light incident in a specific direction may be overlapped with the insulating layer 3060.

Furthermore, the polarizing filter layer 30PF may overlap with the wavelength conversion layer 3080. More specifically, the polarizing filter layer 30PF may be disposed between the insulating layer 3060 and the wavelength conversion layer 3080 along a thickness direction of the wavelength conversion layer 3080.

The polarizing filter layer 30PF may include a plurality of polarizers 30PF1, 30PF2, 30PF3 sequentially disposed along one direction so as to overlap with the plurality of semiconductor light-emitting diodes.

For example, the plurality of polarizers 30PF1, 30PF2, 30PF3 may be formed in a bar shape along the first electrode 3020 as polarizers corresponding to red (R), green (G), and blue (B) pixels, respectively, and sequentially arranged along the second electrode 2040 (refer to FIG. 11).

At this time, a black matrix 30BM is disposed between the polarizers 30PF1, 30PF2, 30PF3 to serve as a partition wall between the polarizers 30PF1, 30PF2, 30PF3.

In other words, black matrices 30BM are disposed between the plurality of polarizers 30PF1, 30PF2, 30PF3 along the one direction, thereby allowing the wavelength conversion layer 3080 and the polarization filter layer 30PF to form a plurality of layers overlapping with each other between the black matrices 30BM. Through this, the black matrices 30BM form a common partition wall between the polarizing filter layer 30PF and the wavelength conversion layer 3080, and thus the polarizers 30PF1, 30PF2, 30PF3 may have the same width as the phosphor portions 3081, 3082, 3083. According to such a structure, the fluorescent filter and the polarizing filter may be integrally provided.

In this case, at least part of the polarizing filter layer 30PF may be recessed toward the wavelength conversion layer 3080. In other words, the polarizing filter layer 30PF may have a concave lens structure. More specifically, in each of the plurality of polarizers 30PF1, 30PF2, 30PF3, an incident surface through which light emitted from the semiconductor light-emitting diodes is incident may be formed to be concave. Since the incident surface has a concave shape, incident light spreads laterally, and therefore light closer to a surface light source may be generated. In this case, fine grooves due to texturing or roughing may be formed on the incident surface.

An adhesive layer 3061 may be formed between the polarizing filter layer 30PF and the insulating layer 3060. The adhesive layer 3061 may be a light-transmitting adhesive layer having excellent optical performance such as an optical adhesive film (OCA) or an optical adhesive resin (OCR). In this case, the adhesive layer 3061 may be formed to be at least partially convex toward the polarizing filter layer 30PF. The convex shape may be formed in a shape corresponding to the concave shape of each of the polarizers 30PF1, 30PF2, 30PF3. Since the adhesive layer 3061 increases its thickness with a convex shape, it may be possible to improve adhesive force.

Moreover, at least part of the black matrix 3090 may be protruded from the polarizing filter layer 30PF toward the semiconductor light-emitting diode. Since the black matrix 3090 is protruded and inserted into the adhesive layer 3061, the black matrix 3090 may function as an anchor to be stuck on the adhesive layer 3061, thereby improving adhesive force.

According to the present example, the point light source may be more uniformly dispersed to the front surface, thereby further improving the image quality of the display.

On the other hand, FIG. 17 illustrates a case where the partition walls are removed and reflective particles are added to the insulating layer.

According to the illustration of FIG. 17, as a display device using semiconductor light-emitting diodes, it is illustrated a case where the structure of the partition wall and the insulating layer are modified from FIG. 16. Accordingly, in the present example to be described below, the same or similar reference numerals are designated to the same or similar components as those of the example described above with reference to FIG. 16, and the description thereof will be substituted by the earlier description.

The display device 3000 includes a substrate 4010, a first electrode 4020, a second electrode 4040, a conductive adhesive layer 4030, an adhesive layer, a polarizing filter layer 40PF, a wavelength conversion layer 4080, a color filter 40CF, and a plurality of semiconductor light-emitting diodes 4050. The structures and functions thereof are the same as those of the display device described above with reference to FIGS. 13 through 16, and therefore, the description thereof will be substituted by the earlier description.

According to the illustration, an insulating layer 4060 may be deposited on the conductive adhesive layer 4030. In a structure in which a solder material connects the first electrode 4020 and the first conductive electrode 4156, the insulating layer 4060 may be deposited on an upper side of the wiring substrate.

In this case, the insulating layer 4060 is formed to fill between the semiconductor light-emitting diodes. More specifically, the insulating layer 2060 may be formed of an insulating material such as polyimide (PI), PET, PEN, or the like.

The insulating layer 4060 may be formed of the same material as an insulating base member of the conductive adhesive layer 4030. In this case, the insulating layer 4060 and the conductive adhesive layer 2030 may be integrated by bonding, and accordingly, the insulating layer 4060 may be integrated with the substrate 4010 while filling between the semiconductor light-emitting diodes to form a single substrate.

According to the drawing, only the insulating layer is filled between the semiconductor light-emitting diodes 4050 with no partition wall.

In this case, the insulating layer 4060 may include reflective particles 4061. The resin of the insulating layer 4060 may be deposited on the conductive adhesive layer 4030 to fill between the plurality of semiconductor light-emitting diodes, and the reflective particles 4061 may be mixed with the resin. In this case, the reflective particles 4061 may include at least one of titanium oxide, alumina, magnesium oxide, antimony oxide, zirconium oxide, and silica. On the other hand, the reflective particles 4061 may be a white pigment.

On the other hand, the reflective particles 4061 may perform the role of re-reflect light that is reflected by the polarizing filter layer 40PF or the wavelength conversion layer 4080 and directed toward an inside of the display device. Meanwhile, the insulating layer 4060 may be formed on a semiconductor wafer because it is deposited on the conductive adhesive layer 4030 to fill between the semiconductor light-emitting diodes.

According to the illustration, the second electrode 2040 (refer to FIG. 11) for electrically connecting the plurality of semiconductor light-emitting diodes may be formed along one direction on one surface of the insulating layer 4060.

The second electrode 2040 may be positioned on the insulating layer 4060 and may be the wiring electrode. The second electrode 2040 is extended toward a neighboring semiconductor light-emitting diode to connect the plurality of semiconductor light-emitting diodes to each other, thereby functioning as an upper wiring.

In this case, the insulating layer 4060 is disposed between the wiring substrate 4010 and the second electrode 2040. The second electrode 2040 may be electrically connected to the semiconductor light-emitting diode 4050 by contact, and may be operated as a scan electrode for transmitting a scan signal. However, the present disclosure is not limited thereto, and the first electrode 4020 may be a scan electrode, and the second electrode 2040 may be a data electrode.

An adhesive layer 4061, a polarizing filter layer 40PF, a wavelength conversion layer 4080 and a color filter 40CF are sequentially deposited on the insulating layer 4060, thereby implementing the structure of the above-described display device. According to the structure described above, the mass productivity may be increased to reduce the manufacturing cost of the display device.

The configurations and methods according to the above-described embodiments will not be applicable in a limited way to the foregoing display device using a semiconductor light-emitting diode, and all or part of each embodiment may be selectively combined and configured to make various modifications thereto.

What is the claimed is:

1. A display device, comprising:
  a substrate formed with wiring electrodes;
  a plurality of semiconductor light-emitting diodes electrically connected to the wiring electrodes;
  an insulating layer configured to fill between the semiconductor light-emitting diodes;
  a polarizing filter layer configured to overlap with the insulating layer to filter light incident in a specific direction; and
  a wavelength conversion layer configured to overlap with the polarizing filter layer to convert the wavelength of light,
  wherein the polarizing filter layer is disposed between the insulating layer and the wavelength conversion layer along a thickness direction of the wavelength conversion layer.

2. The display device of claim 1, wherein the polarizing filter layer comprises a plurality of polarizers sequentially disposed along one direction so as to overlap with the plurality of semiconductor light-emitting diodes, respectively.

3. The display device of claim 2, wherein black matrices are disposed between the plurality of polarizers along the one direction.

4. The display device of claim 3, wherein the wavelength conversion layer overlaps with the plurality of semiconductor light-emitting diodes, respectively, and comprises a plurality of phosphor portions formed between the black matrices.

5. The display device of claim 3, wherein the wavelength conversion layer and the polarizing filter layer form a plurality of layers overlapping with each other between the black matrices.

6. The display device of claim 1, wherein at least part of the polarizing filter layer is formed to be concave toward the wavelength conversion layer.

7. The display device of claim 6, wherein the polarizing filter layer comprises a plurality of polarizers, and an incident surface on which light emitted from the semiconductor light-emitting diodes is incident is formed to be concave, in each of the plurality of polarizers.

8. The display device of claim 7, wherein fine grooves due to texturing are formed on the incident surface.

9. The display device of claim 1, wherein an adhesive layer is formed between the polarizing filter layer and the insulating layer, and at least part of the adhesive layer is formed to be convex toward the polarizing filter layer.

10. The display device of claim 1, wherein the insulating layer is partitioned by a partition wall disposed between the semiconductor light-emitting diodes.

11. The display device of claim 10, wherein the partition wall is formed at a position corresponding to a black matrix for partitioning the wavelength conversion layer into a plurality of phosphor portions.

12. The display device of claim 11, wherein the black matrix has a cross-sectional area larger than that of the partition wall.

13. The display device of claim 11, wherein at least part of the black matrix is protruded from the polarizing filter layer toward the semiconductor light-emitting diode.

14. The display device of claim 1, wherein the wavelength conversion layer comprises a yellow phosphor, and
the wavelength conversion layer overlaps with a color filter.

* * * * *